US011183090B2

(12) United States Patent
Chen

(10) Patent No.: US 11,183,090 B2
(45) Date of Patent: Nov. 23, 2021

(54) TEST CIRCUIT AND TEST METHOD FOR DISPLAY PANELS

(71) Applicants: HKC Corporation Limited, Guangdong (CN); Chongqing HKC Optoelectronics Technology Co., Ltd., Chongqing (CN)

(72) Inventor: Yu-Jen Chen, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 56 days.

(21) Appl. No.: 16/623,269

(22) PCT Filed: Sep. 1, 2017

(86) PCT No.: PCT/CN2017/100252
§ 371 (c)(1),
(2) Date: Dec. 16, 2019

(87) PCT Pub. No.: WO2018/233067
PCT Pub. Date: Dec. 27, 2018

(65) Prior Publication Data
US 2020/0184866 A1    Jun. 11, 2020

(30) Foreign Application Priority Data

Jun. 20, 2017    (CN) .......................... 201710470335.3

(51) Int. Cl.
*G09G 3/00*      (2006.01)
*G01R 31/28*      (2006.01)

(52) U.S. Cl.
CPC ............. *G09G 3/006* (2013.01); *G01R 31/28* (2013.01)

(58) Field of Classification Search
CPC .......... G09G 3/006; G09G 3/36; G01R 31/28; G01R 31/2825
See application file for complete search history.

(56) References Cited

U.S. PATENT DOCUMENTS

| | | | |
|---|---|---|---|
| 8,421,789 B2* | 4/2013 | Ka | G09G 3/3233 345/211 |
| 9,691,314 B2* | 6/2017 | Kim | G09G 3/006 |

(Continued)

FOREIGN PATENT DOCUMENTS

| | | |
|---|---|---|
| CN | 101303462 A | 11/2008 |
| CN | 101847357 A | 9/2010 |

(Continued)

*Primary Examiner* — Akm Zakaria
(74) *Attorney, Agent, or Firm* — Muncy, Geissler, Olds & Lowe, P.C.

(57) ABSTRACT

A test circuit and a test method for display panels are provided. The test circuit comprises: switch units; first test leads; first test pads; and a second test pad, a second test lead, a third test pad and a switch control line. Numbers of the switch units, the first test leads and the first test pads are the same; each of the first test leads is electrically connected to a corresponding one of the display panels; each of the first test pads is electrically connected to an output terminal of the corresponding switch unit, and each of the first test pads is electrically connected to the corresponding first test lead; the second test pad and the second test lead are electrically connected to input terminals of the switch units; and the third test pad and the switch control line are electrically connected to control terminals of the switch units.

15 Claims, 2 Drawing Sheets

(56) References Cited

U.S. PATENT DOCUMENTS

| | | | |
|---|---|---|---|
| 2008/0137021 A1 | 6/2008 | Choi et al. | |
| 2011/0043500 A1* | 2/2011 | Kwak | G09G 3/006 345/206 |
| 2014/0320136 A1* | 10/2014 | Cho | G09G 3/006 324/414 |
| 2014/0354285 A1* | 12/2014 | Kim | G09G 3/3233 324/414 |
| 2015/0339959 A1* | 11/2015 | Li | G09G 3/006 324/760.01 |

FOREIGN PATENT DOCUMENTS

| | | |
|---|---|---|
| CN | 102789076 A | 11/2012 |
| CN | 107065313 A | 8/2017 |
| CN | 107068029 A | 8/2017 |

\* cited by examiner

TEST CIRCUIT AND TEST METHOD FOR DISPLAY PANELS

BACKGROUND

Technical Field

This disclosure relates to the display technology, such as a test circuit and a test method for display panels.

Related Art

In the process of manufacturing a display panel, it is necessary to orient liquid crystal molecules in the display panel. The process of orienting the liquid crystal molecules may adopt the following steps of: applying a voltage signal or a current signal between an array substrate and a color filter substrate, wherein at least one of the array substrate and the color filter substrate has an alignment film, which forms a polymer bulge under the action of the above-mentioned voltage or current. The polymer bulge forms a pretilt angle, which can make the liquid crystal molecules disposed between the array substrate and the color filter substrate be arranged according to a specific direction to enhance the display quality of the display panel.

When the liquid crystal molecules are oriented, each display panel needs an independent lead and a bonding pad connected to the lead, so that traces are complicated. A solution in the associated technology is to connect one lead to a plurality of display panels.

However, adopting one lead connected to a plurality of display panels encounters the following problems: when the array testing is performed on the display panel, the problem of the test signal interference occurs because one lead is connected between the display panels.

SUMMARY

This disclosure provides a test circuit and a test method for display panels to test each of the display panels while the array testing is being performed, and to test the display panels when the liquid crystal molecules are oriented.

A test circuit for display panels comprises:
switch units;
first test leads;
first test pads; and
a second test pad, a second test lead, a third test pad and a switch control line.

Wherein numbers of the switch units, the first test leads and the first test pads are the same; each of the first test leads is electrically connected to a corresponding one of the display panels; each of the first test pads is electrically connected to an output terminal of the corresponding switch unit, and each of the first test pads is electrically connected to the corresponding first test lead; the second test pad and the second test lead are electrically connected to input terminals of the switch units; and the third test pad and the switch control line are electrically connected to control terminals of the switch units.

A test method for display panels comprises: connecting the display panels to a test circuit, wherein the test circuit comprises:
switch units;
first test leads;
first test pads; and
a second test pad, a second test lead, a third test pad and a switch control line.

wherein numbers of the switch units, the first test leads and the first test pads are the same; each of the first test leads is electrically connected to a corresponding one of the display panels; each of the first test pads is electrically connected to an output terminal of the corresponding switch unit, and each of the first test pads is electrically connected to the corresponding first test lead; the second test pad and the second test lead are electrically connected to input terminals of the switch units; and the third test pad and the switch control line are electrically connected to control terminals of the switch units;

controlling the switch units to turn off through the third test pad, and applying a first test signal to the display panel corresponding to the first test pad through the first test pad; and controlling the switch units to turn on through the third test pad, and applying a second test signal to the display panels through the second test pad.

A test circuit for display panels comprises:
switch units;
first test leads;
first test pads; and
a second test pad, a second test lead, a third test pad and a switch control line.

Wherein numbers of the switch units, the first test leads and the first test pads are the same; each of the first test leads is electrically connected to a corresponding one of the display panels; each of the first test pads is electrically connected to an output terminal of the corresponding switch unit, and each of the first test pads is electrically connected to the corresponding first test lead; the second test pad and the second test lead are electrically connected to input terminals of the switch units; and the third test pad and the switch control line are electrically connected to control terminals of the switch units.

Wherein the second test pad and the third test pad neighbor upon each other; the second test lead and the switch control line are disposed in parallel; and the first test pads are arranged in an array along an extending direction of the second test lead.

This disclosure provides a test circuit and a test method for display panels capable of testing each of the display panels while the array testing is being performed, thereby improving the accuracy of the array testing. In addition, the test circuit and test method of this disclosure can form the pretilt angles in a plurality of display panels while the liquid crystal molecules are oriented, thereby improving the efficiency of orienting the liquid crystal molecules in the display panels.

BRIEF DESCRIPTION OF THE DRAWINGS

The embodiments will become more fully understood from the detailed description and accompanying drawings, which are given for illustration only, and thus are not limitative of the present invention, and wherein.

DETAILED DESCRIPTION OF THE INVENTION

The embodiments of the invention will be apparent from the following detailed description, which proceeds with reference to the accompanying drawings, wherein the same references relate to the same elements.

Figure 1:
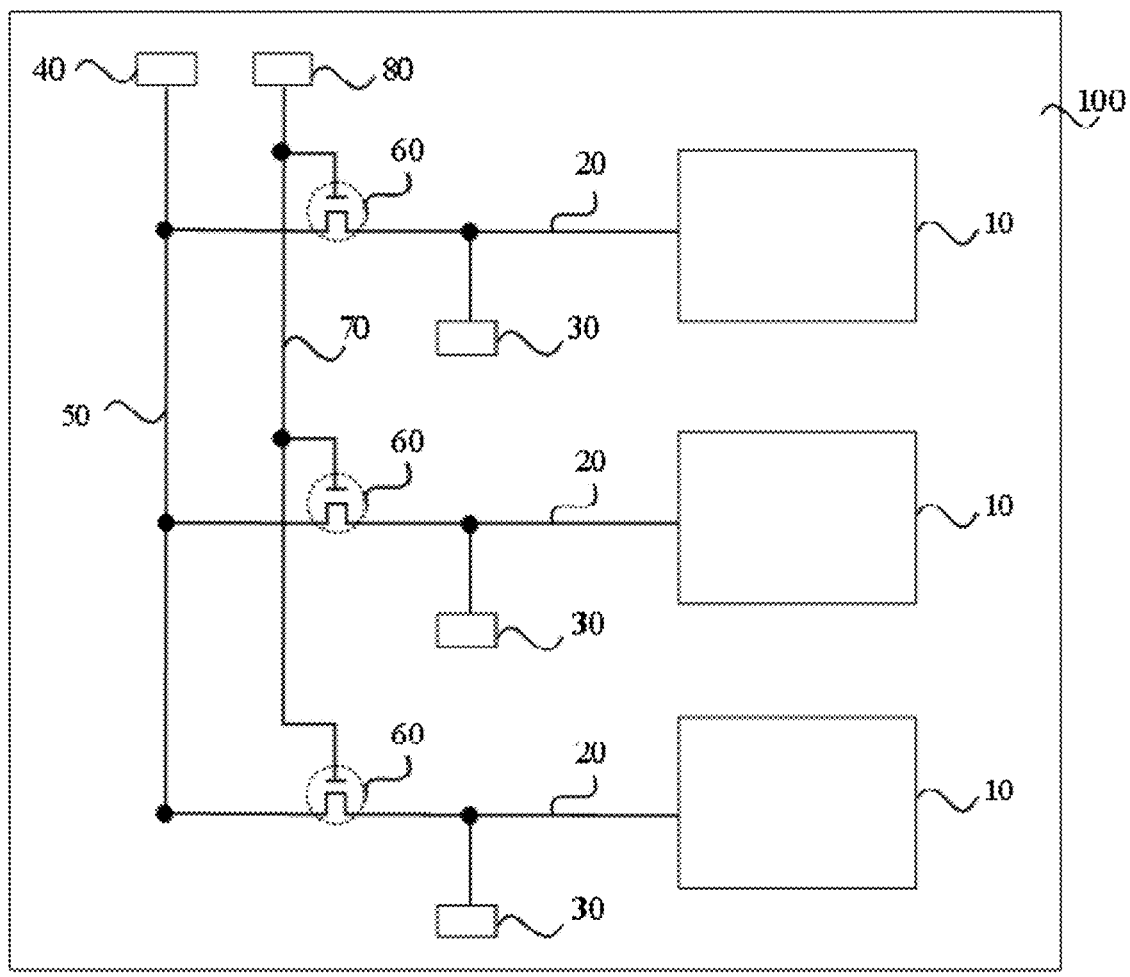
FIG. 1 shows a test circuit for display panels provided by this embodiment.

FIG. 1 shows a test circuit for display panels provided by this embodiment. Referring to FIG. 1, the test circuit for the display panels provided by this embodiment includes switch units 60, first test leads 20, first test pads 30, a second test pad 40, a second test lead 50, a third test pad 80 and a switch control line 70. The numbers of the switch units 60, the first test leads 20 and the first test pads 30 are the same. Each of the first test leads 20 is configured to be electrically connected to a corresponding one of the display panels 10. The display panels 10 are formed on a mother substrate 100. Each of the first test pads 30 is electrically connected to an output terminal of the corresponding switch unit 60, and each of the first test pads 30 is electrically connected to the corresponding first test lead 20. The second test pad 40 and the second test lead 50 are electrically connected to input terminals of the switch units 60. The third test pad 80 and the switch control line 70 are electrically connected to control terminals of the switch units 60, to concurrently control the switch units 60 to turn on or off. In FIG. 1, the switch unit 60 is exemplarily configured as a transistor for the description without restricting this embodiment thereto. In other implementation methods, the switch unit may further be a device, which has a control terminal, an input terminal and an output terminal, and is capable of implementing the control of the signal transmission relationship between the input terminal and the output terminal through the control terminal. The transistor may be an electronic transistor, a field effect transistor, a thin film transistor or the like. For the field effect transistor and the thin film transistor, the input terminal may be a source or a drain, the output terminal may be the drain or the source, and the control terminal may be a gate.

Optionally, the second test pad 40 and the third test pad 80 neighbor upon each other. The advantages of this arrangement are that the distance between the second test lead 50 electrically connected to the second test pad 40 and the switch control line 70 electrically connected to the third test pad 80 is minimum, and the design space is saved. Thus, the second test pad 40 and the third test pad 80 neighbor upon each other in order to facilitate the use of the probes to simultaneously load the signal outputted from the signal source into the second test pad 40 and the third test pad 80 when the liquid crystal molecules are oriented in the display panels 10.

In FIG. 1, only the switch control line 70 electrically connected to the control terminals of the three transistors are exemplarily disposed. In this embodiment, the number of the transistors electrically connected to the switch control line 70 is not limited.

The test circuit for the display panels provided by this embodiment are provided with the switch units 60, the third test pad 80 and the switch control line 70, and the third test pad 80 and the switch control line 70 are electrically connected to the control terminals of the switch units 60. The switch units 60 are controlled to turn off when the array testing is performed on the display panel 10, the problem of the test signal interference occurring due to one lead connected between the display panels 10 is prevented, the testing of each of the display panels 10 independently while the array testing is being performed is achieved, and the accuracy of the array testing is improved. The switch units 60 are controlled to turn on through the third test pad 80 and the switch control line 70 when the liquid crystal molecules are oriented in the display panels 10, so that the formation of the pretilt angles in the display panels 10 while the liquid crystal molecules are oriented is achieved, and the efficiency of orienting the liquid crystal molecules in the display panels is improved.

In addition, compared with in the case where each of the display panels 10 in the related technology needs to be provided with a switch control line 70 and a third test pad 80, disposing only a third test pad 80 and a switch control line 70 in this embodiment can simplify the traces and save the costs. The liquid crystal molecules in the display panels are oriented by, for example, adding chemical monomers to the liquid crystal. In the process of the alignment, the chemical monomers are subjected to the irradiation of the ultra-violet rays and are polymerized to form polymer bulges for fixing the liquid crystal to form a pretilt angle. The orientation process of the liquid crystal molecules may be performed by applying an alignment voltage sequence to the display panel, wherein the liquid crystal is overturned in an ordered manner under the action of the electric field, and then the voltage is keep unchanged. Meanwhile, the ultra-violet rays are used to irradiate the display panel, and the chemical monomers in the display panels are polymerized under the condition of the irradiation of the ultra-violet rays to form polymer bulges arranged in an ordered manner, so that the display panel forms a pretilt angle, and the liquid crystal molecules are arranged in an ordered manner under the action of the pretilt angle of the display panel.

Figure 2:
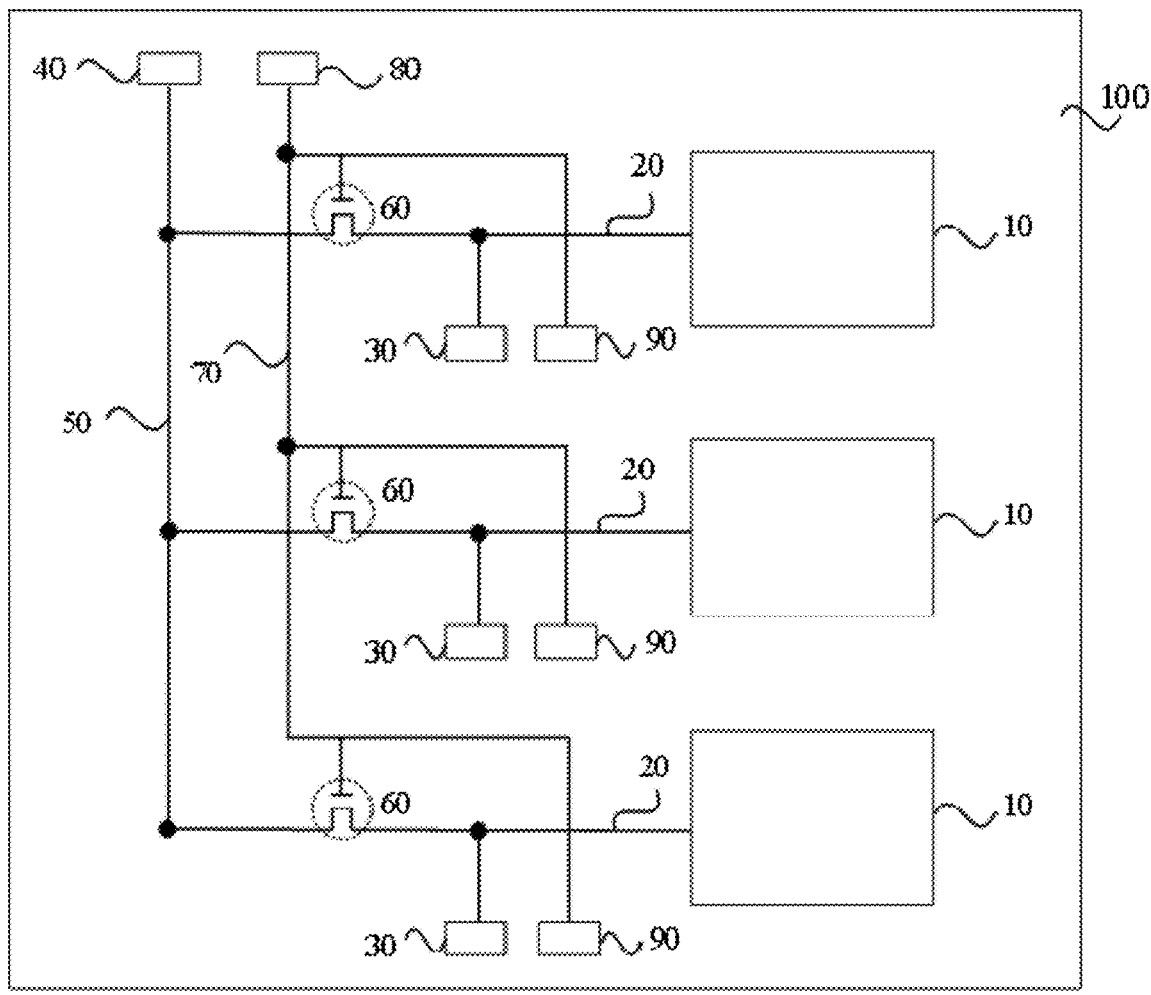
FIG. 2 shows another test circuit for display panels provided by this embodiment.

FIG. 2 is another test circuit for display panels provided by this embodiment. As shown in FIG. 2, on the basis of the above-mentioned embodiment, the test circuit provided by this embodiment may also include fourth test pads 90. Each of the fourth test pads 90 corresponds to a display panel 10, and is electrically connected to a control terminal of a transistor 60 (in order to describe the test method in conjunction with the drawings where the transistors serve as the switch units, the same symbol "60" denotes the transistors and the switch units), and the first test pad 30 and the fourth test pad 90 corresponding to the same display panel 10 neighbor upon each other. Because when the array testing is performed on the display panels 10, it is necessary to apply test signals to the first test pads 30 and to ensure that there is no mutual signal interference between the display panels (that is, the switch unit 60 needs to be in the off state), the first test pad 30 and the fourth test pad 90 neighbor upon each other in order to facilitate the use of the probes to simultaneously load the signal outputted from the signal source into the first test pad 30 and the fourth test pad 90. Thus, it is possible to control the transistor 60 to turn off through the fourth test pad 90, and to send the test signal to the display panel 10 through the first test pad 30 at the same time.

On the basis of the above-mentioned embodiment, optionally, the transistor 60 is an N-type thin film transistor, and the N-type thin film transistor has a lower turn-on voltage and can be easily manufactured.

On the basis of the above-mentioned embodiment, optionally, the first test pads 30 are arranged in an array along an extending direction of second test lead 50 to facilitate the use of the probe to apply the test signal to the first test pad.

On the basis of the above-mentioned embodiment, optionally, the second test lead 50 and the switch control line 70 are disposed in parallel to save the wiring space.

In some embodiments, the display panel can be a liquid crystal display panel, a quantum dot liquid crystal display panel, or any of other display panels, and the display panel can be applied to, for example, a cell phone, a tablet computer, or a TV.

The mother substrate 100 shown in FIGS. 1 and 2 may be made of a glass substrate. Compared with the production of the single display panel 10 at a time, simultaneously manufacturing a plurality of display panels 10 on the same mother substrate 100 can improve the production efficiency of the display panel 10. After performing the array testing on the display panels 10 on the mother substrate 100 and orienting the liquid crystal molecules, the mother substrate 100 is cut so as to obtain an independent display panel 10. In the process of cutting the mother substrate 100, the above-mentioned test circuit can be cut and removed, that is, the above-mentioned test circuit may not be included in the independent display panel 10 after the cutting is completed.

This embodiment further provides a test method for display panels. Referring to FIGS. 1 and 2, the method is based on the test circuit for the display panels, which includes: the switch units 60, the first test leads 20, the first test pads 30, the second test pad 40, the second test lead 50, the third test pad 80 and the switch control line 70. The numbers of the switch units 60, the first test leads 20 and the first test pads 30 are the same. Each of the first test leads 20 is configured to be electrically connected to a corresponding one of the display panels 10. Each of the first test pads 30 is electrically connected to the output terminal of the corresponding switch unit 60, and each of the first test pads 30 is electrically connected to the corresponding first test lead 20. The second test pad 40 and the second test lead 50 are electrically connected to the input terminals of the switch units 60, and the third test pad 80 and the switch control line 70 are electrically connected to the control terminals of the switch units 60. The switch unit is a device, such as the transistor and the like, which has the control terminal, the input terminal and the output terminal, and is capable of implementing the control of the signal transmission relationship between the input terminal and the output terminal through the control terminal. The transistor may be an electronic transistor, a field effect transistor, a thin film transistor or the like. For the field effect transistor and the thin film transistor, the input terminal may be a source or a drain, the output terminal may be the drain or the source, and the control terminal may be a gate.

The test method for the display panels provided by this embodiment includes: controlling the switch units 60 to turn off, and applying a first test signal to the display panel 10 corresponding to the first test pad 30 through the first test pad 30 when the array testing is performed on the display panel 10; and controlling the switch units 60 to turn on, and applying a second test signal to the display panels 10 through the second test pad 40 when the liquid crystal molecules are oriented in the display panels 10.

Optionally, the switch units 60 can be transistors. In order to describe the test method in conjunction with the drawings where the transistors serve as the switch units, the same symbol "60" denotes the transistor and the switch unit.

Optionally, when the array testing is performed on the display panel 10, a plurality of transistors 60 are controlled to turn off through the third test pad 80, for example, a low level signal is applied to the third test pad 80 to control the transistors 60 to turn off, and the first test signal is applied to the display panel 10 corresponding to the first test pad 30 through the first test pad 30. When the liquid crystal molecules are oriented in the display panels 10, a plurality of transistors 60 are controlled to turn on through the third test pad 80, for example, a high level signal is applied to the third test pad 80 to control the transistors 60 to turn on, and the second test signal is applied to the display panels 10 through the second test pad 40. In other implementation methods, when the array testing is performed on the display panel 10, no control signal is applied to the control terminal of the transistor 60. At this time, the control terminal of the transistor 60 is turned off, and the first test signal is applied to the display panel 10 corresponding to the first test pad 30 through the first test pad 30.

Optionally, the test circuit further comprises a plurality of fourth test pads 90. Each of the fourth test pads 90 corresponds to one of the display panels 10, and each of the fourth test pads 90 is electrically connected to a control terminal of the transistor 60. The first test pad 30 and the fourth test pad 90 corresponding to the same display panel 10 neighbor upon each other. When the array testing is performed on the display panel 10, the control signal is inputted through the fourth test pad 90 to control the transistors 60 to turn off, and the first test signal is applied to the display panel 10 corresponding to the first test pad 30 through the first test pad 30. When the liquid crystal molecules are oriented in the display panels 10, the control signal is inputted through third test pad 80 to control the transistors 60 to turn on, and the second test signal is applied to the display panels 10 through the second test pad 40.

Optionally, the second test pad 40 and the third test pad 80 neighbor upon each other. The advantages of this arrangement are that the distance between the second test lead 50 electrically connected to the second test pad 40 and the switch control line 70 electrically connected to the third test pad 80 is minimum, and the design space is saved. Thus, the second test pad 40 and the third test pad 80 neighbor upon each other in order to facilitate the use of the probes to simultaneously load the signal outputted from the signal source into the second test pad 40 and the third test pad 80 when the liquid crystal molecules are oriented in the display panels 10.

On the basis of the above-mentioned embodiment, optionally, the transistor 60 is an N-type thin film transistor, and the N-type thin film transistor has a lower turn-on voltage and can be easily manufactured.

On the basis of the above-mentioned embodiment, optionally, the first test pads 30 are arranged in an array along an extending direction of second test lead 50 to facilitate the use of the probe to apply the test signal to the first test pad.

On the basis of the above-mentioned embodiment, optionally, the second test lead 50 and the switch control line 70 are disposed in parallel to save the wiring space.

In the test method for the display panels provided by this embodiment, the switch units 60 are controlled to turn off when the array testing is performed on the display panel 10, the problem of the test signal interference occurring due to one lead connected between the display panels 10 is prevented, the testing of each of the display panels 10 independently while the array testing is being performed is achieved, and the accuracy of the array testing is improved. The switch units 60 are controlled to turn on through the third test pad 80 and the switch control line 70 when the liquid crystal molecules are oriented in the display panels 10, so that the formation of the pretilt angles in a plurality of display panels 10 while the liquid crystal molecules are oriented is achieved, and the efficiency of orienting the liquid crystal molecules in the display panels is improved.

What is claimed is:

1. A test circuit for display panels formed on a mother substrate which is cut to obtain independent display panels after testing is complete, the test circuit simultaneously testing the display panels and comprising:
   switch units formed on the mother substrate wherein each of the switch units is a transistor;

first test leads formed on the mother substrate;
first test pads formed on the mother substrate;
a second test pad, a second test lead, a third test pad and a switch control line formed on the mother substrate; and
fourth test pads formed on the mother substrate and each corresponding to one of the display panels, wherein each of the fourth test pads is electrically connected to a control terminal of the transistor,
wherein numbers of the switch units, the first test leads and the first test pads are the same; each of the first test leads is electrically connected to a corresponding one of the display panels; each of the first test pads is electrically connected to an output terminal of the corresponding switch unit, and each of the first test pads is electrically connected to the corresponding first test lead; the second test pad and the second test lead are electrically connected to input terminals of the switch units; and the third test pad and the switch control line are electrically connected to control terminals of the switch units,
wherein the first test pad and the fourth test pad corresponding to the same display panel neighbor upon each other.

2. The test circuit according to claim 1, wherein the second test pad and the third test pad neighbor upon each other.

3. The test circuit according to claim 1, wherein the transistor is an N-type thin film transistor.

4. The test circuit according to claim 1, wherein an input terminal of the transistor is a source or a drain, an output terminal of the transistor is the drain or the source, and a control terminal of the transistor is a gate.

5. The test circuit according to claim 1, wherein the first test pads are arranged in an array along an extending direction of the second test lead.

6. The test circuit according to claim 1, wherein the second test lead and the switch control line are disposed in parallel.

7. A test method for display panels formed on a mother substrate which is cut so as to obtain independent display panels after testing is completed, the test method comprising: connecting the display panels to a test circuit formed on the mother substrate and simultaneously testing the display panels, wherein the test circuit comprises:
switch units, wherein each of the switch units is a transistor;
first test leads;
first test pads;
a second test pad, a second test lead, a third test pad and a switch control line; and
fourth test pads each corresponding to one of the display panels, wherein each of the fourth test pads is electrically connected to a control terminal of the transistor,
wherein numbers of the switch units, the first test leads and the first test pads are the same; each of the first test leads is electrically connected to a corresponding one of the display panels; each of the first test pads is electrically connected to an output terminal of the corresponding switch unit, and each of the first test pads is electrically connected to the corresponding first test lead; the second test pad and the second test lead are electrically connected to input terminals of the switch units; and the third test pad and the switch control line are electrically connected to control terminals of the switch units;
controlling the switch units to turn off through the third test pad, and applying a first test signal to the display panel corresponding to the first test pad through the first test pad; and
controlling the switch units to turn on through the third test pad, and applying a second test signal to the display panels through the second test pad,
wherein the first test pad and the fourth test pad corresponding to the same display panel neighbor upon each other;
wherein a control signal is inputted through the fourth test pad to control the transistors to turn off, and a first test signal is applied to the display panel corresponding to the first test pad through the first test pad.

8. The test method according to claim 7, wherein controlling the transistors to turn off through the third test pad comprises: applying a low level signal to the third test pad to control the transistors to turn off; and
controlling the transistors to turn on through the third test pad comprises: applying a high level signal to the third test pad to control the transistors to turn on.

9. The test method according to claim 7, wherein controlling the transistors to turn off through the third test pad comprises: applying no control signal to the third test pad to control the transistors to turn off.

10. The test method according to claim 7, wherein inputting the control signal through the fourth test pad to control the transistors to turn off comprises: applying a low level signal to the fourth test pad to control the transistors to turn off.

11. The test method according to claim 7, wherein the second test pad and the third test pad neighbor upon each other.

12. The test method according to claim 7, wherein the transistor is an N-type thin film transistor.

13. The test method according to claim 7, wherein an input terminal of the transistor is a source or a drain, an output terminal of the transistor is the drain or the source, and a control terminal of the transistor is a gate.

14. The test method according to claim 7, wherein the first test pads are arranged in an array along an extending direction of the second test lead.

15. The test method according to claim 7, wherein the second test lead and the switch control line are disposed in parallel.

* * * * *